United States Patent [19]

Rinderle et al.

[11] Patent Number: 5,235,288
[45] Date of Patent: Aug. 10, 1993

[54] AMPLIFIER STAGE FOR LOW-RESISTANCE AC VOLTAGE SOURCES

[75] Inventors: Heinz Rinderle; Hans Sapotta, both of Heilbronn, Fed. Rep. of Germany

[73] Assignee: TELEFUNKEN electronic GmbH, Heilbronn, Fed. Rep. of Germany

[21] Appl. No.: 831,989

[22] Filed: Feb. 6, 1992

[30] Foreign Application Priority Data

Feb. 19, 1991 [DE] Fed. Rep. of Germany ....... 4104980

[51] Int. Cl.$^5$ .............................................. H03F 3/26
[52] U.S. Cl. ................................... 330/264; 330/267; 330/276
[58] Field of Search .............................. 330/262–268, 330/276

[56] References Cited

U.S. PATENT DOCUMENTS 2,782,267 2/1957 Beck ................................... 330/263

FOREIGN PATENT DOCUMENTS 565635 11/1958 Canada ............................... 330/263
63955 6/1978 Japan ................................ 330/265
2121635 12/1983 United Kingdom .

OTHER PUBLICATIONS

IBM Technical Disclosure Bulletin, vol. 31, No. 10, Mar. 1989; "High Performance Totem-Pole Drive", pp. 304–306.

Primary Examiner—James B. Mullins
Attorney, Agent, or Firm—Spencer, Frank & Schneider

[57] ABSTRACT

An amplifier stage for use with low-resistance AC voltage sources has first and second complimentary transistors, each having a control terminal, a current input terminal and a current output terminal. The transistors are connected together at a first junction point, a current terminal of the second complementary transistor being connected at the first junction point to a corresponding current terminal of the first complimentary transistor. The respective other corresponding current terminals of the transistors are connected to respective opposite poles of a direct current supply, so that the first transistor, the second transistor, and the direct current supply form a series connection providing a common quiescent current to the transistors. The transistors are each provided with a respective separate direct current operating voltage at a respective control terminal. The transistors are connected to receive an input AC voltage at respective corresponding current input terminals, thereby receiving the input AC voltage in parallel.

14 Claims, 4 Drawing Sheets

AMPLIFIER STAGE FOR LOW-RESISTANCE AC VOLTAGE SOURCES

BACKGROUND OF THE INVENTION

1. Field of the Invention

The invention relates to an amplifier for low resistance AC voltages sources.

2. Background Information

Amplifier stages for low-resistance AC voltage sources—for example HF receiver input stages in radio receivers—are usually made using bipolar technology with a transistor in a base circuit, or using FET technology with a transistor in a gate circuit. A high linearity can be achieved in the circuit by a high collector current or drain current; for example, with a collector current of 10 mA and a source impedance of 50 ohms, the interception point—this value being the measure for the non-linearities in low-level signal operation—is only 10 dBm. At the same time, the base circuit and drain circuit have very favorable noise properties; for example, amplifier noise factors of 2 dB are obtained with a collector current of 3 mA.

Amplifier stages must frequently—for example in the vicinity of strong transmitters—process signals with high signal levels (+10 dBm or more, corresponding to a peak signal current of 20 mA at 50 ohms input resistance). In order for the amplifier circuit to function linearly, the collector current of the input transistor must be high in relation to this peak signal current; in order to ensure linearity in the circuit, the collector current must be increased accordingly with high input signal levels, and hence the operating point of the circuit moved. However, an increase of this size in the collector current is only possible to a limited extent. For example, doubling the collector current corresponds to an increase in the interception point of only 6 dBm. This is however offset by the fact that the interception point only inadequately characterizes the linearity conditions at high signal levels. Increasing the collector current also has the effect of increasing the noise factor, since the noise sources in the transistor generate a noise power proportional to the collector current; the increased power loss causes problems with the dependability of the circuit.

SUMMARY OF THE INVENTION

The object underlying the invention is to provide an amplifier stage that has good properties even with high and variable signal levels and that can be optimized by the user for the respective application.

The amplifier stage in accordance with the invention is formed substantially of two complementary transistors in a base circuit or gate circuit and which are connected in parallel for the AC voltage and in series for the DC voltage. The two half-waves of the AC voltage input signal are processed by different transistors—the one transistor amplifies the negative half-wave of the input signal, and the complementary transistor the positive half-wave; the output signal is formed by addition of the output signals of both transistors. The input voltage is here supplied to the emitter or source electrodes of the two transistors, while the output voltage can be picked up resistively, capacitively or by means of transformers at the collector or drain electrodes of the two transistors.

Since both half-waves of the input signal contribute to the output signal of the amplifier stage, their properties can be considerably improved. Non-linear distortions of the output signal are reduced, interference effects are minimized since the amplitudes of the interference quantities are subtracted from one another. The current input and hence the noise of the amplifier stage can be reduced compared with standard amplifier stages. The power loss of the circuit is reduced, producing in portable sets longer battery life and in sets with long service lives an increase in dependability.

The user can here select the properties or combinations thereof that are most advantageous to him. For example, a collector current reduced compared to that in the prior art leads to improved noise characteristics and identical linearity; or an identical collector current produces identical noise characteristics and considerably increased linearity.

A further advantage is that the current input of the amplifier stage automatically adjusts to the actual requirement, since a variable signal current shifts the operating point of the transistors in the right direction. If for example the amplifier stage is triggered with a high signal level, the input signal current shifts the direct current of the transistors towards higher values—the linearity of the circuit therefore increases automatically with its modulation.

The amplifier stage in accordance with the invention is therefore characterized by a wide dynamic range or dynamic modulation range, low noise, low power requirement and low non-linearities.

BRIEF DESCRIPTION OF THE DRAWINGS

The invention is described in greater detail in the following on the basis of FIGS. 1 to 8.

DETAILED DESCRIPTION OF THE PREFERRED EMBODIMENTS

Figure 1:
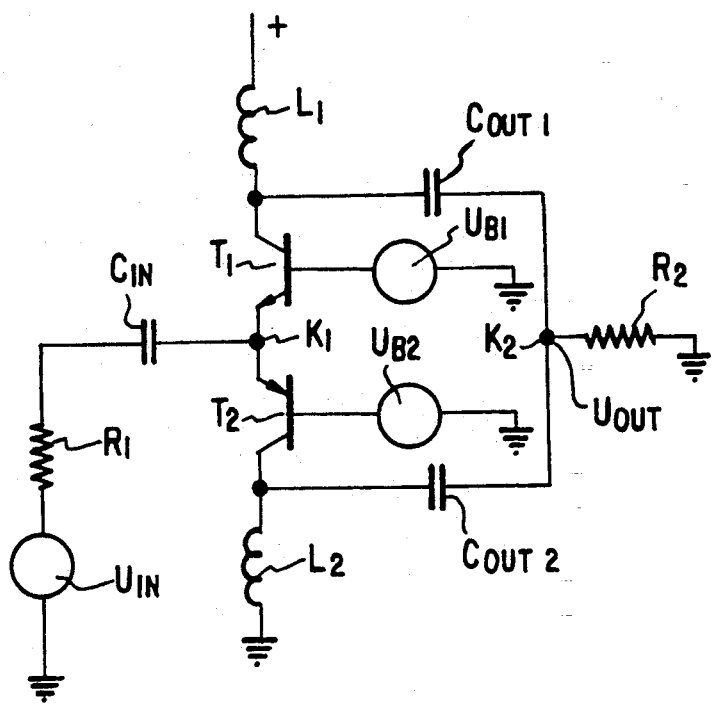
FIGS. 1 to 3 here show various design forms of the amplifier stage in bipolar technology.

In accordance with FIG. 1, the amplifier stage comprises the NPN transistor $T_1$, the complementary PNP transistor $T_2$, the input resistor or source impedance $R_1$, the load resistor $R_2$, the capacitors $C_{IN}$, $C_{OUT1}$ and $C_{OUT2}$, and the two choke coils $L_1$ and $L_2$. The emitters of the two transistors $T_1$ and $T_2$ are connected to one another at the node $K_1$, to which is also applied the input voltage $U_{IN}$ supplied via the source impedance $R_1$ and the capacitor $C_{IN}$. The operating control voltages $U_{B1}$ and $U_{B2}$ are applied to the respective bases of the two transistors, and the collectors are connected to the supply voltage or to the reference potential via the choke coils $L_1$ and $L_2$ and at the same time to the node $K_2$ via the capacitors $C_1$ and $C_2$. The output voltage $U_{OUT}$ is also tapped at this node $K_2$, for example via the load resistor $R_2$. In the embodiment in accordance with FIG. 2, the two collectors of the transistors $T_1$ and $T_2$ are connected to one another at the node $K_2$; the input voltage $U_{IN}$ is supplied via the source impedance $R_1$ and the two capacitors $C_{IN1}$ and $C_{IN2}$ to the two emitters of transistors $T_1$ and $T_2$, which are connected to the supply voltage and to the reference potential via choke coils $L_1$ and $L_2$ respectively. The output voltage $U_{OUT}$ is tapped at the node $K_2$, for example via the capacitor $C_{OUT}$ and the load resistor $R_2$. To achieve a maximum modulation range for the two transistors, the operating voltages $U_{B1}$ and $U_{B2}$ of the two transistors $T_1$ and $T_2$ respectively are re-adjusted such that the DC voltage at the collectors corresponds to precisely half the supply voltage. The circuit of the amplifier stage in FIG. 3 corresponds substantially to that of FIG. 1; the output voltage $U_{OUT}$ at the collectors of transistors $T_1$ and $T_2$ is however supplied by means of the transformer Ü.

Figure 2:
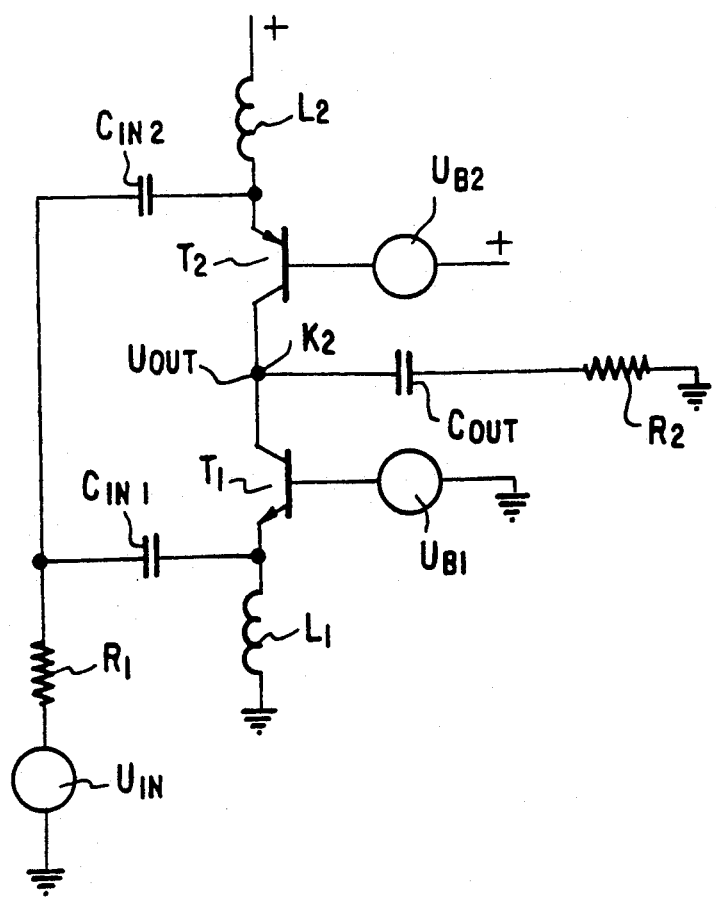

Unlike in standard push-pull circuits, it is possible with the amplifier stages shown in FIGS. 1 and 2 for both the input signal and the output signal to be tapped in one phase without the use of transformers. In the embodiment shown in FIG. 1, the output signal is coupled to the load resistor $R_2$, and in the embodiment shown in FIG. 2 to the output capacitor $C_{OUT}$ and to load resistor $R_2$.

Figure 3:
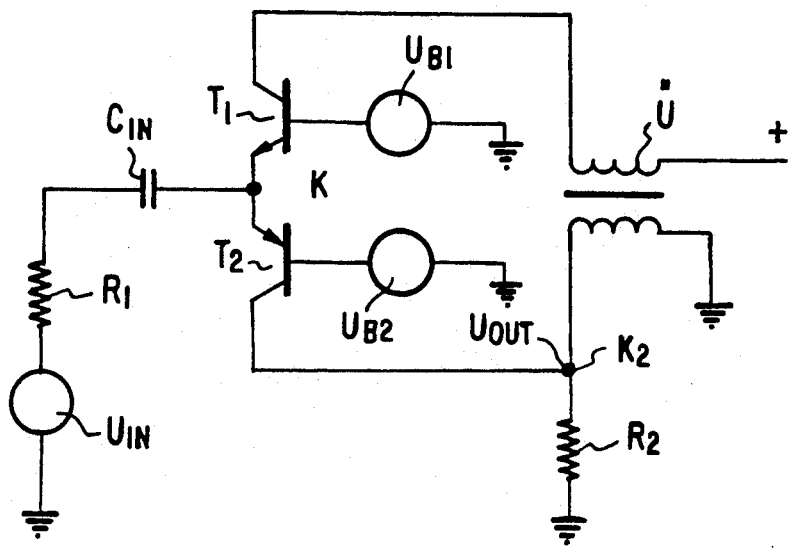

The output signals of the two transistors can also—as shown in the embodiment in FIG. 3—be added up by transformation at the collectors of the two transistors by means of a transformer, as a result of which the two choke coils $L_1$ and $L_2$ and the two capacitors $C_{OUT1}$ and $C_{OUT2}$ in the circuit array in FIG. 1 can be dispensed with here. The entire amplifier stage is preferably integrated into an integrated circuit.

Figure 4:
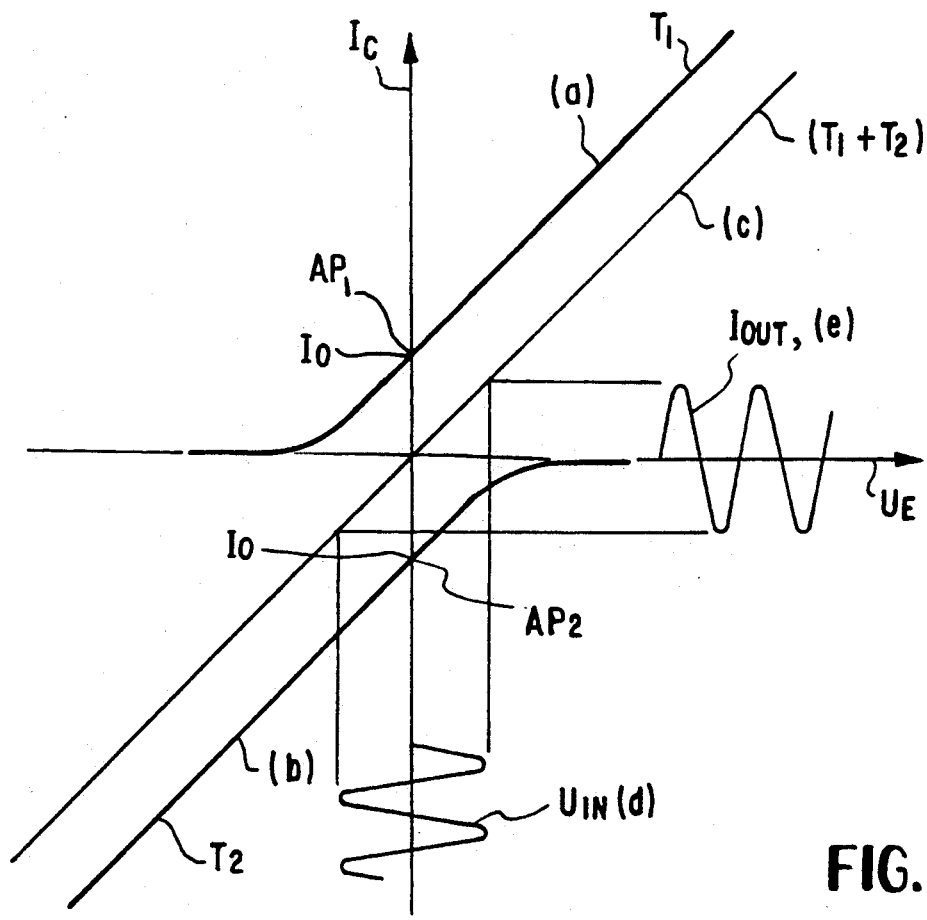
FIG. 4 shows the transfer characteristic of these amplifier stages, FIG. 5a the individual output currents of the amplifier stage, FIG. 5b the combined output currents, and FIG. 6 a comparative diagram for the distortion factor.

FIG. 4 shows the transfer characteristic of the two complementary transistors operated in a base circuit; the collector current $I_C$ is plotted on the ordinate and the emitter voltage $U_E$ on the abscissa. The curve (a) shows the characteristic of the NPN transistor $T_1$ with the operating point $AP_1$, curve (b) the characteristic of the PNP transistor $T_2$ with the operating point $AP_2$, and curve (c) the characteristic resulting from the addition of the two characteristics of the individual transistors. Furthermore, the input voltage $U_{IN}$—curve (d) and the output current $I_{OUT}$—curve (e)—are included.

In FIG. 4, the advantages of the amplifier stage are evident: non-linearities in the characteristics of the individual transistors $T_1$ and $T_2$ are eliminated by addition, the operating points $AP_1$ and $AP_2$ can be selected with a low quiescent current $I_O$ in order to obtain low noise figures, and the operating points are automatically moved in the desired direction with variable signal levels of the input voltage $U_{IN}$ so that the dynamics of the amplifier stage remain completely intact.

Figure 5A:
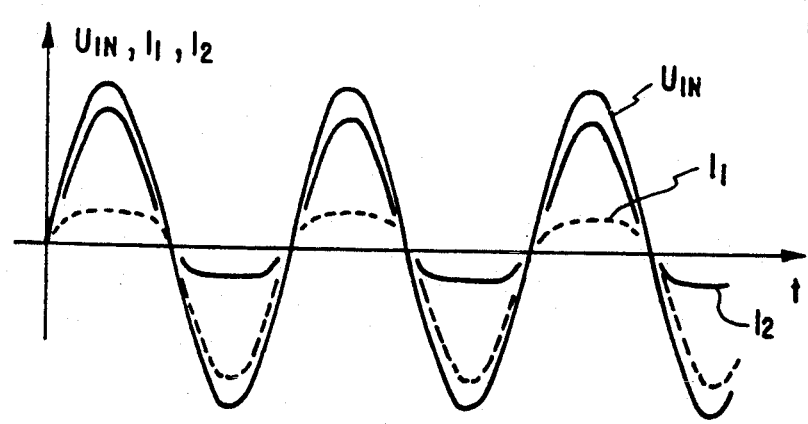
Figure 5B:
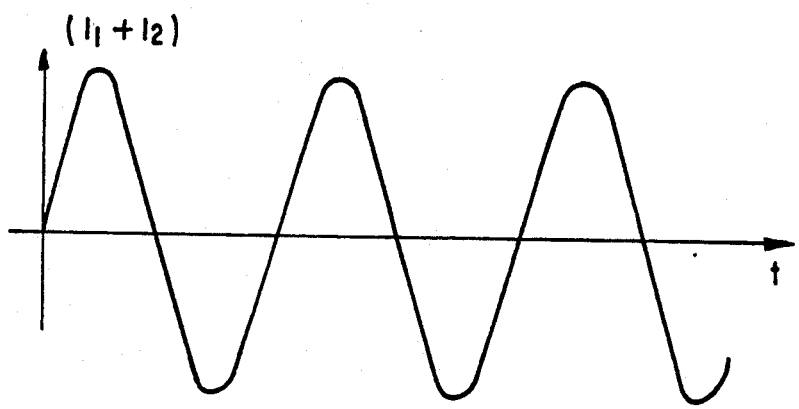

FIGS. 5a and 5b show the timing of the input voltage $U_{IN}$ and the collector currents $I_1$ and $I_2$ of transistors $T_1$ and $T_2$, with FIG. 5a showing the individual currents $I_1$ and $I_2$ of the two transistors $T_1$ and $T_2$, and FIG. 5b the sum of the two currents ($I_1$ and $I_2$).

FIG. 5a makes clear that when only one transistor $T_1$ or $T_2$ is used in the amplifier stage, only a very narrow linear modulation range can be selected, and non-linear distortions inevitably occur. By contrast, when two transistors are used in the amplifier stage—which process different half-waves of the input signal—a very wide linear modulation range is available (FIG. 5b).

The resultant improvements in the properties of the amplifier stage can be proved quantitatively on the basis of numerical values. As an example, the distortion factor k—a measure of the non-linearities of the amplifier stage—was determined at different input voltages with a standard amplifier stage and with an amplifier stage in accordance with the invention, with equal noise factors being selected for both circuit arrays.

Figure 6:
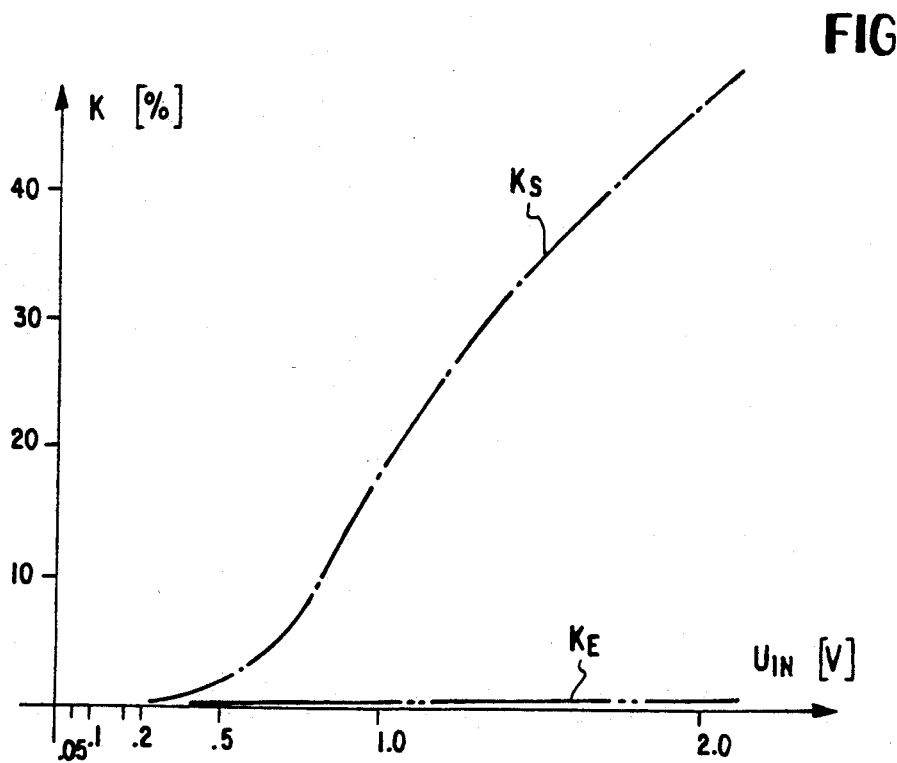

In FIG. 6, the distortion factor is plotted over the input voltage $U_{IN}$, where $k_S$ reproduces the curve with a standard amplifier stage and $k_E$ the curve with the amplifier stage in FIG. 1 and in accordance with the invention. Comparison of the two curves shows clearly that at high signal levels of the input voltage in particular, a considerable reduction of the distortion factor and hence a marked improvement of the linearity can be achieved.

It is of course possible to reduce the noise value and the quiescent current—with the non-linearity nonetheless reduced—if it is intended to improve these properties of the amplifier stage.

Figure 7:
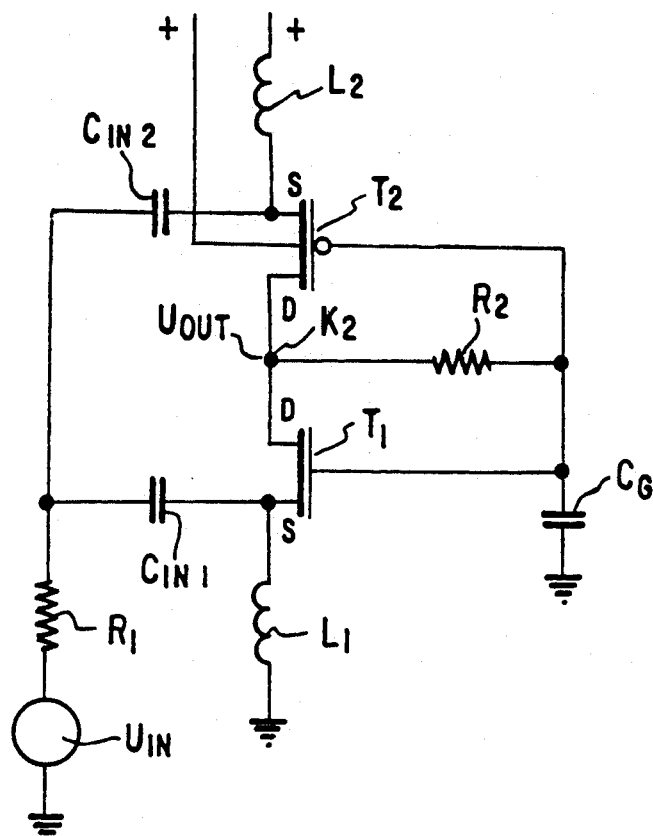
FIGS. 7 and 8 show further embodiments of the amplifier stages in CMOS technology.

FIG. 7 shows as a further embodiment an amplifier stage in FET technology. This amplifier stage substantially corresponds to the array in FIG. 2; the two complementary FET transistors—the NMOS transistor $T_1$ and the PMOS transistor $T_2$ replacing the two bipolar transistors $T_1$ and $T_2$—are connected to one another by the drain electrodes at node $K_2$; at this node $K_2$ the output signal $U_{OUT}$ is also tapped. $C_G$ is the negative feedback capacitor.

Figure 8:
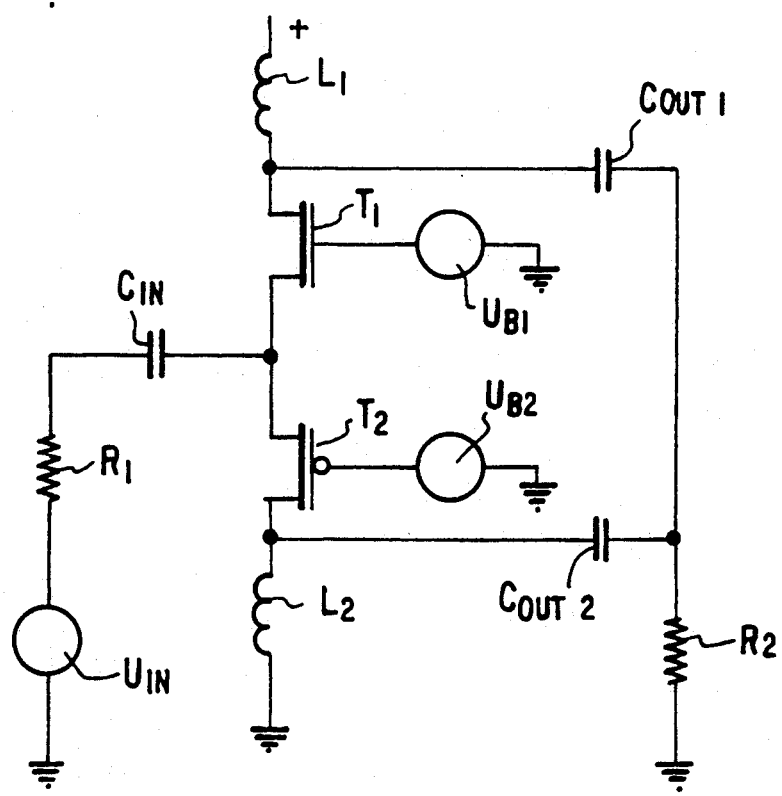

Furthermore, a further possible embodiment is the circuit shown in FIG. 8, in which the source electrodes of the two field-effect transistors $T_1$ and $T_2$ are connected to one another; the output voltage is here tapped via the two drain electrodes at the load resistor $R_2$. This embodiment is substantially equivalent to the corresponding bipolar circuit shown in FIG. 1.

If MOS-FETs are used, the amplifier stage can be very easily integrated in CMOS technology.

What is claimed is:

1. An amplifier stage for use with low-resistance, low power AC voltage sources, comprising:

first and second complimentary transistors, each having a control terminal, a current input terminal and a current output terminal;

wherein said first and second complimentary transistors are connected together at a first junction point, with a current terminal of said second complementary transistor being connected at the first junction point to a corresponding current terminal of said first complimentary transistor, and with the respective other corresponding current terminals of said complimentary transistors being connected to respective opposite poles of a direct current supply, whereby the first transistor, the second transistor, and the direct current supply form a series connection providing a common quiescent current to said transistors;

wherein said first and second complementary transistors are each provided with a respective separate direct current operating voltage at a respective control terminal; and wherein said first and second transistors are connected to receive an input AC voltage at respective corresponding current input terminals, thereby receiving the input AC voltage in parallel.

2. An amplifier stage according to claim 1, wherein an output AC voltage is tapped in parallel from the current output terminals of said transistors.

3. An amplifier stage according to claim 2, wherein said first and second complementary transistors are bipolar transistors, with said current input terminals being emitters, said current output terminals being collectors, and said control terminals being bases of said bipolar transistors.

4. An amplifier stage according to claim 3, wherein the input voltage is supplied via a capacitor C to the emitters of said transistors, and said emitters are the current terminals connected at said first junction point.

5. An amplifier stage according to claim 4, wherein the collectors of said transistors are connected via respective chokes to the direct current supply, and wherein the output AC voltage is tapped from a second junction point to which said collectors of said transistors are connected via respective capacitors.

6. An amplifier stage according to claim 4, wherein said output AC voltage is tapped from a second junction point to which said collectors of said transistors are connected via a transformer.

7. An amplifier stage according to claim 3, wherein said input AC voltage is supplied to the emitters of said transistors via capacitors, wherein the emitters of said transistors are connected via chokes to the direct current supply voltage, and wherein said output AC voltage is tapped from a second junction point at which said collectors of said transistors are connected.

8. An amplifier stage according to claim 2, wherein said complementary transistors are field-effect transistors, with said current input terminals being sources, said current output terminals being drains, and said control terminals being gates of said field-effect transistors.

9. An amplifier stage according to claim 8, wherein said field-effect transistors are MOS transistors.

10. An amplifier stage according to claim 9, wherein said input AC voltage is supplied via a capacitor to the first junction point to which said source terminals of said transistors are connected, wherein said drain terminals are connected via chokes to the direct current supply voltage, and wherein said output AC voltage is tapped from a second junction point to which said drain terminals of said transistors are connected via respective capacitors.

11. An amplifier stage for use with low-resistance, low power AC voltage sources, comprising:
   first and second complimentary field-effect transistors, each having a gate terminal, a source terminal and a drain output terminal;
   wherein said drain terminals of said transistors are connected together at a first junction point, with the source terminals of said transistors being connected to respective opposite poles of a direct current supply, whereby the first transistor, the second transistor, and the direct current supply form a series connection providing a common quiescent current to said transistors;
   wherein an input AC voltage is supplied in parallel to the respective source terminals of said transistors via respective capacitors;
   wherein said source terminals are connected via chokes to the direct current supply voltage; and
   wherein an output AC voltage is tapped from said first junction point to which the drain electrodes of said transistors are connected.

12. A low power amplifier arrangement comprising:
   first and second complimentary transistors, each having a corresponding respective current input terminal, current output terminal and control terminal, a first set of corresponding respective current terminals being connected to a first node, a second set of corresponding current terminals being connected to respective opposite poles of a power source providing a common quiescent current to both of said transistors, and respective control terminals being connected to separate respective control voltages;
   input means for receiving an AC input signal and supplying said AC input signal to said first and second complimentary transistors in parallel, said input means comprising an input capacitor connected to said first node; and
   output means for providing an output AC signal from said complimentary transistors.

13. The arrangement according to claim 12, wherein said output means comprises first and second output capacitors connected to respective ones of said second set of current terminals.

14. The arrangement according to claim 12, wherein said output means comprises an output transformer having first and second windings, the first winding being connected between a first one of said second set of current terminals and a first pole of said power source, the second winding being connected between a second one of the second set of current terminals and a second pole of said power source, a load being connected across the second winding.

* * * * *